United States Patent
Sun

(10) Patent No.: US 10,579,592 B2
(45) Date of Patent: Mar. 3, 2020

(54) METHOD AND APPARATUS FOR COMPRESSING AN APPLICATION

(71) Applicant: Alibaba Group Holding Limited, Georgetown, Grand Cayman (KY)

(72) Inventor: Zeduo Sun, Hangzhou (CN)

(73) Assignee: Alibaba Group Holding Limited, Grand Cayman (KY)

( * ) Notice: Subject to any disclaimer, the term of this patent is extended or adjusted under 35 U.S.C. 154(b) by 239 days.

(21) Appl. No.: 15/855,889

(22) Filed: Dec. 27, 2017

(65) Prior Publication Data

US 2018/0189313 A1  Jul. 5, 2018

(30) Foreign Application Priority Data

Dec. 31, 2016  (CN) .......................... 2016 1 1266088

(51) Int. Cl.
*G06F 16/00* (2019.01)
*G06F 16/174* (2019.01)
*G06F 16/25* (2019.01)
*H03M 7/30* (2006.01)

(52) U.S. Cl.
CPC ........ *G06F 16/1744* (2019.01); *G06F 16/258* (2019.01); *H03M 7/30* (2013.01); *H03M 7/3088* (2013.01); *H03M 7/3086* (2013.01)

(58) Field of Classification Search
CPC ..... H03M 7/30; G06F 16/258; G06F 16/1744
See application file for complete search history.

(56) References Cited

U.S. PATENT DOCUMENTS

| 5,909,638 | A | * | 6/1999 | Allen ..................... G06Q 30/06 348/E7.073 |
| 9,448,782 | B1 | | 9/2016 | Gershnik et al. |
| 2006/0010151 | A1 | * | 1/2006 | Star Sung ........... H03M 7/3084 |
| 2010/0131475 | A1 | * | 5/2010 | Kataoka .................. G06F 16/81 707/693 |
| 2012/0289147 | A1 | | 11/2012 | Raleigh et al. |
| 2013/0047149 | A1 | | 2/2013 | Xu et al. |
| 2013/0117579 | A1 | | 5/2013 | Ham |
| 2014/0006347 | A1 | | 1/2014 | Qureshi et al. |
| 2014/0006772 | A1 | | 1/2014 | Qureshi et al. |
| 2014/0007048 | A1 | | 1/2014 | Qureshi et al. |
| 2014/0007182 | A1 | | 1/2014 | Qureshi et al. |
| 2014/0007183 | A1 | | 1/2014 | Qureshi et al. |
| 2014/0007192 | A1 | | 1/2014 | Qureshi et al. |
| 2014/0007193 | A1 | | 1/2014 | Qureshi et al. |
| 2014/0007214 | A1 | | 1/2014 | Qureshi et al. |
| 2014/0007222 | A1 | | 1/2014 | Qureshi et al. |
| 2014/0040638 | A1 | | 2/2014 | Barton et al. |
| 2014/0041034 | A1 | | 2/2014 | Li et al. |
| 2014/0057620 | A1 | | 2/2014 | Lin |
| 2014/0096186 | A1 | | 4/2014 | Barton et al. |
| 2014/0189679 | A1 | | 7/2014 | Adams et al. |

(Continued)

*Primary Examiner* — Cheryl Lewis

(57) ABSTRACT

The size of a source application is reduced by compressing a plurality of invoked files, such as SO files, in the source application with a compression algorithm that has a higher compression rate compared to a default compression rate. A decompression file that corresponds with the compression algorithm is inserted into a plurality of invoking files in the source application so that the source application itself can decompress the invoked files that were compressed with the compression algorithm.

27 Claims, 12 Drawing Sheets

(56) References Cited

U.S. PATENT DOCUMENTS

| | | |
|---|---|---|
| 2014/0258247 A1 | 9/2014 | Chu et al. |
| 2015/0011311 A1 | 1/2015 | Relan et al. |
| 2015/0012924 A1 | 1/2015 | Liu et al. |
| 2015/0113040 A1 | 4/2015 | Marquess |
| 2016/0093232 A1 | 3/2016 | Chong et al. |
| 2016/0099972 A1 | 4/2016 | Qureshi et al. |
| 2016/0321116 A1 | 11/2016 | Schwartz, Jr. et al. |
| 2016/0335422 A1 | 11/2016 | Hong et al. |
| 2016/0378451 A1 | 12/2016 | Walker |
| 2016/0378452 A1 | 12/2016 | Tsao et al. |
| 2017/0070238 A1 | 3/2017 | Liang |
| 2017/0120151 A1 | 5/2017 | Relan et al. |
| 2017/0177317 A1 | 6/2017 | Mark et al. |
| 2017/0177318 A1 | 6/2017 | Mark et al. |
| 2017/0177319 A1 | 6/2017 | Mark et al. |
| 2017/0249140 A1 | 8/2017 | Sun |

\* cited by examiner

METHOD AND APPARATUS FOR COMPRESSING AN APPLICATION

CROSS-REFERENCE TO RELATED APPLICATIONS

This application claims priority to Chinese Patent Application No. 201611266088.7, filed on Dec. 31, 2016, which is incorporated herein by reference in its entirety.

BACKGROUND OF THE INVENTION

1. Field of the Invention

The present application relates to the field of application compression technologies and, in particular, to a method and an apparatus for compressing an application.

2. Description of the Related Art

For example, for an APK application used in an Android operating system. APK (Android application package) is an application file format used by an Android operating system to distribute and install mobile applications and middleware. In order to run the code of an Android application on an Android device, the code must be first compiled and then packed into a file recognizable by an Android system. Such a file format that can be recognized and run by the Android system is "APK." An APK file includes compiled code files, file resources, certificates, and manifest files.

The reduction of the APK file size is one of the goals for continuous optimization of commercial applications. Reducing the size of an APK application is mainly achieved by modifying the application's own function and logical framework. However, if an APK application has optimized the choice of its own service logic, the size may be further reduced by recompressing the generated APK application or changing the size of its video, audio, and image resources.

A default compression algorithm that is used for shared object (SO) files in an APK application is a deflate algorithm, which is used during the generation of the APK application. However, after an APK application has been installed in an Android mobile phone, when the mobile phone runs the APK application, the SO files in the APK application need to be decompressed first when the SO files are loaded. A decompression algorithm built into an Android system also implements loading through the deflate algorithm.

Due to the limitations of some operation system, the original default compression algorithm thereof cannot be changed, and it is impossible to directly use an algorithm having a higher compression rate to perform compression.

SUMMARY OF THE INVENTION

The present invention provides methods and mediums for reducing the size of a source application. The present invention provides a method of compressing a source application. The method compresses at least one invoked file in the source application using a compression algorithm to form a compressed invoked file. In addition, the method also modifies at least one invoking file to form a modified invoking file. The modified invoking file invokes a decompression function file corresponding to the compression algorithm. The decompression function file decompresses and loads a compressed invoked file. Further, the method additionally encapsulates the modified invoking file, the compressed invoked file, and the decompression function file to obtain a compressed application.

In addition, the present invention also provides a method for decompressing a source application. The method decapsulates a compressed application using a first decompression algorithm to obtain invoking files, invoked files compressed using a preset compression algorithm, and a decompression function file using a second decompression algorithm that corresponds to the preset compression algorithm. The invoking files are modified to invoke the decompression function file. Further, during invoking of the invoked files by the invoking files, the method invokes the decompression function file to decompress and load the compressed invoked files. The first decompression algorithm corresponds to a first compression algorithm that has a rate of compression that is less than a rate of compression of the preset compression algorithm.

Further, the present invention also provides a non-transitory computer-readable medium that has computer-readable instructions stored thereon to be executed by a processor to perform a method for compressing an application. The method includes compressing at least one invoked file in a source application using a compression algorithm to form a compressed invoked file. The method also includes modifying at least one invoking file to form a modified invoking file. The modified invoking file to invoke a decompression function file corresponding to the compression algorithm. The decompression function file to decompress and load a compressed invoked file. The method additionally includes encapsulating the modified invoking file, the compressed invoked file, and the decompression function file to obtain a compressed application.

In addition, the present invention provides a non-transitory computer-readable medium that has computer-readable instructions stored thereon to be executed by a processor to perform a method for decompressing an application. The method includes decapsulating a compressed application using a first decompression algorithm to obtain invoking files, invoked files compressed using a preset compression algorithm, and a decompression function file using a second decompression algorithm that corresponds to the preset compression algorithm. The invoking files are modified to invoke the decompression function file. The method further includes, during invoking of the invoked files by the invoking files, invoking the decompression function file to decompress and load the compressed invoked files. The first decompression algorithm corresponds to a first compression algorithm that has a rate of compression that is less than a rate of compression of the preset compression algorithm.

A better understanding of the features and advantages of the present invention will be obtained by reference to the following detailed description and accompanying drawings which set forth an illustrative embodiment in which the principals of the invention are utilized. In order to provide a better description of the technical means of the present application so as to implement the present application according to the contents of the specification, and to make the above and other objectives, features, and advantages of the present application easier to understand, specific embodiments of the present application are given below.

BRIEF DESCRIPTION OF THE DRAWINGS

Various other advantages and benefits will become apparent to those of ordinary skill in the art by reading the detailed description of the preferred embodiments in the following text. The drawings are only for the purpose of illustrating preferred embodiments and are not construed as limiting the present application. Moreover, the same reference symbols are used to indicate the same parts throughout the drawings. In the drawings.

DETAILED DESCRIPTION OF THE INVENTION

Figure 1A:
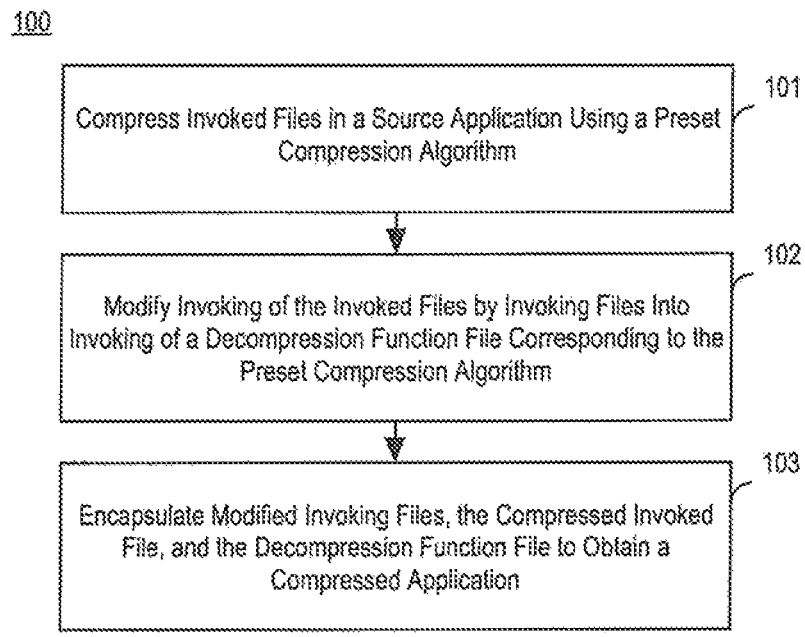
FIG. 1A is a flowchart illustrating an example of a method 100 of compressing a source application in accordance with the present invention.

Exemplary embodiments of the present disclosure will be described in more detail with reference to the drawings. Although the exemplary embodiments of the present disclosure are shown in the drawings, it should be understood that the present disclosure can be implemented in various forms and should not be limited by the embodiments set forth here. Instead, these embodiments are provided to offer a more thorough understanding of the present disclosure, and to fully communicate the scope of the present disclosure to those skilled in the art.

The present application may be applied to compression of an application and decompression of the application. During development of an application, it is required to optimize the application and the size of the application as much as possible from all aspects. For example, for an APK application used in an Android operating system, during generation of the APK application, the shared object (SO) files in the APK application can be compressed using a compression algorithm, and then the compressed files can be encapsulated into the APK application, so that compression of the APK application can be done and the size of the APK application can be reduced.

In the present application, a source application is a computer program that needs to accomplish one or more specific tasks through invoking an invoked file by an invoking file. For example, an APK application in an Android operating system is a source application (computer program). An invoking file is an executable code file extracted from the source application (computer program). For example, a dex file, which is an executable code file extracted from an APK application, is an invoking file.

An invoked file is a code file that is extracted from the source application (computer program) and needs to be loaded by the invoking file (executable code file) during program running. For example, a SO file extracted from the APK application is an invoked file. A function in the invoking file (executable code file) can be invoked to load the invoked file (e.g., SO file) by executing code of the invoking file (executable code file).

In the present application, a preset compression algorithm is a data compression algorithm, and may be, specifically, any appropriate compression algorithm, and is preferably a compression algorithm having a high compression rate for achieving desirable technical effects, which is not limited in the present application.

FIG. 1A shows a flow chart that illustrates an example of a method 100 of compressing a source application in accordance with the present invention. As shown in FIG. 1A, method 100 begins at step 101 by compressing the invoked files (e.g., SO files) in a source application using a preset compression algorithm to form a compressed invoked file. Optionally, more than one compressed invoked files can be formed. At least one invoked file exists in the source application, and compressing all or some invoked files using the preset compression algorithm may be specifically compressing the invoked files into one or more compressed invoked files, which may not be limited in the present application. For example, all SO files can be extracted from an APK application, and then compressed into one compressed SO file, i.e., a compressed invoked file, using a LZMA (short for Lempel-Ziv-Markov chain-algorithm) algorithm.

After the invoked files have been compressed into a compressed invoked file using the preset compression algorithm, method 100 moves to step 102 to modify the invoking files (executable code files), which invoke the invoked files (e.g., SO files), so that the invoking files (executable code files) invoke a decompression function file that corresponds to the preset compression algorithm.

The decompression function file is used for decompressing and loading a compressed invoked file. The decompression function file, which refers to a file precompiled for the preset compression algorithm, is capable of decompressing the compressed invoked file and loading code of the invoked file. The decompression function file is also an invoked file that can be invoked by an invoking file (executable code file).

Since the invoked files have now been compressed by the preset compression algorithm, the original steps to invoke the invoked files by the invoking files (executable code file) can no longer be executed successfully. Therefore, the original logic of the invoking files (executable code files) needs to be modified. The process to invoke the invoked files by the invoking files (executable code files) is modified to invoke a decompression function file that corresponds to the preset compression algorithm.

After such a modification, when code of the invoking files (executable code files) is executed, a decompression function file capable of decompressing the invoked files (which were compressed by the preset compression algorithm) can be loaded, and then the original invoked files can be obtained. For example, in a main dex (executable) file of an APK application, the original steps to invoke all of the SO files is modified to invoke SO file decompressing and loading, where the SO files were compressed by the LZMA algorithm.

After the invoking files (executable code files) have been modified, method 100 moves to step 103 to encapsulate the modified invoking files, the compressed invoked file, and the decompression function file using a default compression algorithm to obtain a compressed application. The compressed application is an application partially compressed by the preset compression algorithm and subjected to corresponding modification.

The modified invoking files, the compressed invoked file, and the decompression function file are repacked and encapsulated into a new application to obtain a compressed application. For example, the modified dex (executable) files, all the SO files compressed by the LZMA algorithm, and the precompiled SO file capable of processing the LZMA algorithm are repacked into the APK application, and the obtained APK application is a compressed application.

According to this embodiment of the present application, the invoked files in a source application are compressed using a preset compression algorithm, such as an algorithm that has a higher compression rate than that of an original compression algorithm. As a result, the compression rate for compressing the application can then be improved, and an application of a smaller size can be obtained.

Further, the invoking files (executable code files) are modified to invoke a decompression function file that corresponds to the preset compression algorithm. The modified invoking files, the compressed invoked file, and the decompression function file are then encapsulated to obtain a compressed application, so that the application can invoke an algorithm capable of decompressing the preset compression algorithm for decompression during running.

In this way, the problem of being originally incompatible with an algorithm that has a high compression rate can be solved. In this case, the application itself has the function of decompressing a compression algorithm having a high compression rate, and a normal running of an application adopting a higher compression rate is ensured.

Figure 1B:
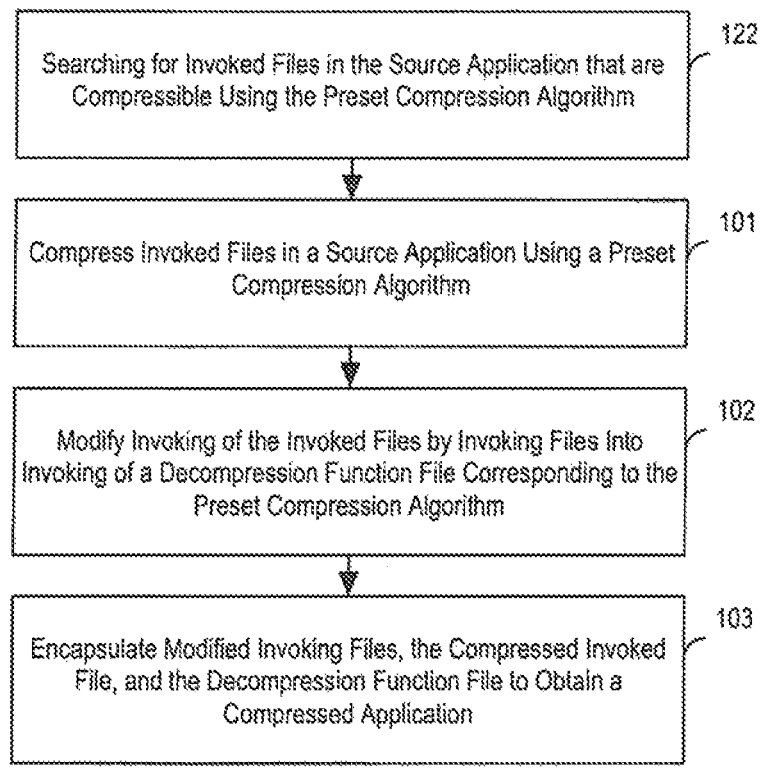
FIG. 1B is a flow chart illustrating an example of a method 120 of compressing a source application in accordance with an alternate embodiment of the present invention.

FIG. 1B shows a flow chart that illustrates an example of a method 120 of compressing a source application in accordance with an alternate embodiment of the present invention. Methods 100 and 120 are similar and, as a result, utilize the same reference numerals to designate the steps that are common to both methods.

As shown in FIG. 1B, method 120 differs from method 100 in that method 120 begins at step 122 by first searching for invoked files in the source application that are compressible using the preset compression algorithm. The source application may have multiple types of files. Invoked files that are compressible using the preset compression algorithm are invoked files to which the preset compression algorithm is applicable and which do not disable normal running of the application. The invoked files that are compressible using the preset compression algorithm are found in various files of the source application. For example, all types of files may be found in the source application, and all of the SO files in the found files are files that are compressible using the preset compression algorithm.

In a preferred embodiment of the present application, the invoked files are dynamic link library files, and the invoking files are executable files invoking the dynamic link library files. In addition, searching for invoked files in the source application that are compressible using the preset compression algorithm in step 122 may specifically include searching for the dynamic link library files from multiple types of files included in the source application.

A dynamic link library file is a non-executable binary program file that allows programs to share code and other resources required for executing special tasks. An executable file refers to a file that can be loaded and executed by an operating system. Executable files are presented in different manners in different operating system environments. The dynamic link library file is an invoked file that is compressible using the preset compression algorithm, and the dynamic link library files are searched for from multiple types of files included in the source application.

Figure 1C:
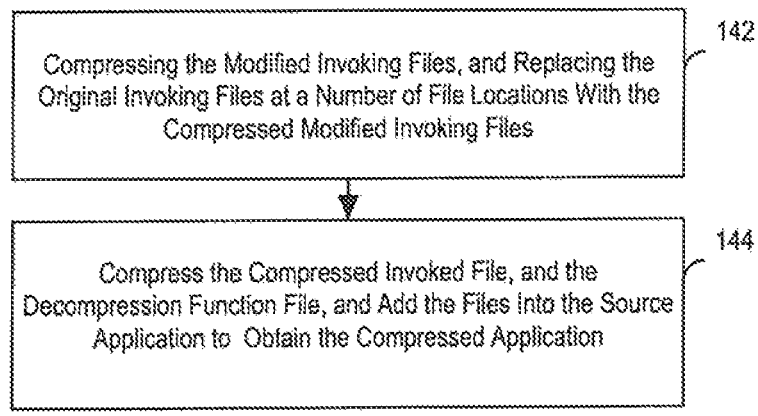
FIG. 1C is a flow chart illustrating an example of a method 140 of encapsulating files in accordance with an embodiment of the present invention.

FIG. 1C shows a flow chart that illustrates an example of a method 140 of encapsulating files in accordance with an embodiment of the present invention. Method 140 can be utilized to implement step 103 in FIG. 1A. As shown in FIG. 1C, method 140 begins at step 142 by compressing the modified invoking files, and then replacing the original invoking files at a number of file locations with the compressed modified invoking files at the file locations.

Following this, method 140 moves to step 144 to compress the compressed invoked file generated in step 101 and the decompression function file and add them into the source application to obtain the compressed application. Then, placing the compressed modified invoking files to file locations of the invoking files before modification may be specifically deleting the invoking files before modification and then placing the compressed modified invoking files at the file locations of the invoking files before modification.

Although the modified invoking files may specifically be compressed using any appropriate compression method, which is not limited in the present application, the invoked files are compressed with a rate of compression that is higher than the rate of compression used to compress the modified invoking files and the compressed invoked files.

If the application includes plug-ins, the modified invoking files are compressed and placed into original plug-ins thereof. For example, all modified dex files are compressed and placed into original plug-ins thereof. The compressed invoked file and the decompression function file are compressed into the source application to obtain the compressed application. Specifically, any appropriate compression method may be used, which is not limited in the present application.

In a preferred embodiment, an invoking file belonging to a main framework can be extracted and compressed in step 142, and then used to replace an original main-framework file of the source application with the compressed main-framework file. If the application has only one invoking file, the invoking file is a main-framework invoking file. If the application is divided into multiple invoking files, start-related components are put in one invoking file, and the invoking file is referred to as a main-framework invoking file. Other invoking files may be referred to as secondary invoking files and may be dynamically loaded upon start.

In the present application, the decompression function file is added to the main-framework invoking file. An invoking file belonging to a main framework of the application is extracted for compression to obtain a compressed main-framework file. The replacing an original main-framework file of the source application with the compressed main-framework file can be implemented by placing the compressed main-framework file into a root directory of an application package.

In a preferred embodiment of the present application, the preset compression algorithm is a LZMA algorithm. LZMA (short for Lempel-Ziv-Markov chain-Algorithm) is a data compression algorithm that has been developed since 2001 and is used in a 7z format in a 7-Zip archiver or an xz format in Unix-like. LZMA uses a dictionary encoding mechanism like LZ77, and generally has a higher compression rate than that of bzip2. For example, the size of a dictionary file for compression may be 4 GB. The LZMA algorithm is an algorithm having a higher compression rate than that of a default deflate algorithm of an Android system. The use of the algorithm can bring a higher compression rate to an APK application.

Figure 2A:
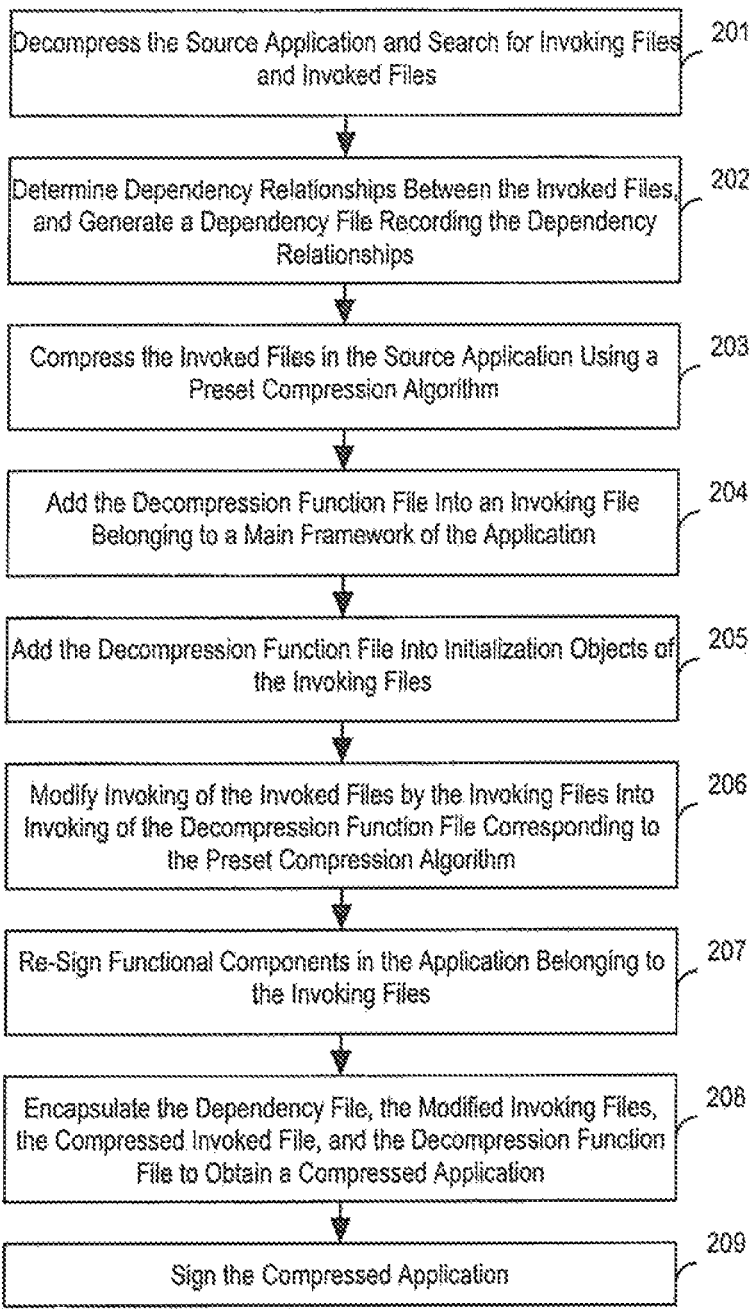
FIG. 2A is a flowchart illustrating an example of a method 200 of compressing a source application in accordance with the present invention.

FIG. 2A shows a flow chart that illustrates an example of a method 200 of compressing a source application in accordance with the present invention. As shown in FIG. 2A, method 200 begins at step 201 by decompressing the source application and searching for invoking files and invoked files. The source application is a compressed program package, and the source application is decompressed using a corresponding decompression method to obtain all files in the program package, so as to find all invoking files and invoked files. For example, an APK application is decompressed, and all dex files and SO files are found.

Following this, method 200 moves to step 202 to determine dependency relationships between the invoked files, and generate a dependency file recording the dependency relationships. Dependency relationships between the invoked files are determined according to the found invoked files, and the dependency relationship of each invoked file is recorded into a dependency file. The dependency file is a file recording dependency relationships of all invoked files.

Specifically, a dynamic dependency table executed by each invoked file may be read. The dynamic dependency tables are tables for the invoked files to mutually invoke dependency relationships. The dynamic dependency table of each invoked file is recorded, and dependency tables for loading of all the invoked files are generated. For example, for SO files of the APK application that are found by parsing, a dynamic dependency table executed by each SO file is read, the dynamic dependency table of each SO file is recorded, and a dependency table file for SO loading is generated.

Next, method 200 moves to step 203 to compress the invoked files in the source application using a preset compression algorithm to form a compressed invoked file. In this embodiment of the present application, the specific implementation is consistent with that described in prior embodiments, the details of which are omitted to avoid repetition.

After the invoked files have been compressed, method 200 moves to step 204 to add the decompression function file into an invoking file belonging to a main framework of the application. There may be multiple ways to add the decompression function file into the invoking file belonging to the main framework of the application.

For example, external invoking code can be added into the main-framework invoking file so that the invoking file can externally invoke the decompression function file. Alternatively, code of the decompression function file may be added into the invoking file belonging to the main framework of the application, so that the function of the decompression function file decompressing and loading a compressed invoked file can be executed more quickly during execution of the invoking file.

If the application has only one invoking file, the invoking file is a main-framework invoking file. If the application is divided into multiple invoking files, start-related components are put in one invoking file, and the invoking file is referred to as a main-framework invoking file. For example, initialization code, a self-defined SO file for decompressing files compressed by the LZMA algorithm, and loading code may be added into a main dex file of the APK application.

Figure 2B:
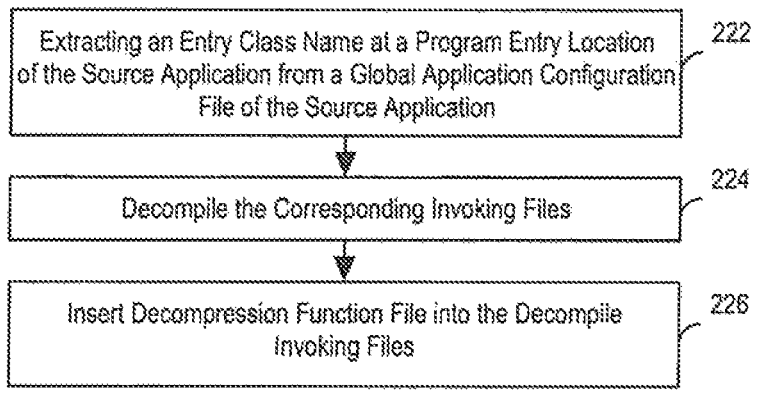
FIG. 2B is a flow chart illustrating an example of a method 220 of adding the decompression function file into initialization objects of the invoking files in accordance with the present invention.

FIG. 2B shows a flow chart that illustrates an example of a method 220 in accordance with the present invention. Method 220 can be utilized to implement step 204. As shown in FIG. 2B, method 220 begins at 222 by extracting an entry class name at a program entry location of the source application from a global application configuration file of the source application.

The global application configuration file refers to an information description file of the entire application that describes components included in the application, defines a running process of the application, declares permissions required for accessing the components of this program by other programs, and lists libraries to be connected for running the application. An entry class name at a program entry location of the source application is extracted from the global application configuration file. For example, an AndroidManifest.xml file in the APK application is parsed to acquire a program entry point.

Following this, method 220 moves to step 224 to decompile the corresponding invoking files. During the addition of the decompression function file into the invoking file belonging to the main framework of the application, first, the corresponding invoking file needs to be decompiled; and then the decompression function file is added into the invoking file. Moreover, during the modification of the invoking of the invoked files by all the invoking files into invoking of the decompression function file corresponding to the preset compression algorithm, first, the corresponding invoking files need to be decompiled, and then the invoking is modified.

For example, all dex files are decompiled, all functions related to SO file loading in the dex files of the APK application are found; and the functions are modified in a unified manner into loading code of an added self-defined SO file decompressing LZMA-compressed files. After this, method 220 moves to step 226 to insert the decompression function file into the decompiled invoking files.

Referring again to FIG. 2A, after method 200 adds the decompression function file into the invoking file in step 204, method 200 moves to step 205 to add the decompression function file into initialization objects of the invoking files. The initialization objects of the invoking files refer to instances to be created initially during execution of the invoking files, and the decompression function file is added into the initialization objects of the invoking files.

Figure 2C:
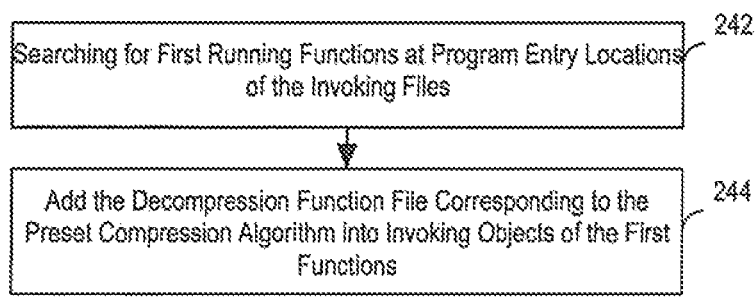
FIG. 2C is a flow chart illustrating a method 240 in accordance with the present invention.

FIG. 2C shows a flow chart that illustrates an example of a method 240 of adding the decompression function file into initialization objects of the invoking files in accordance with the present invention. Method 240 can be utilized to implement step 205 in FIG. 2A. As shown in FIG. 2C, method 240 begins at 242 by searching for first running functions at program entry locations of the invoking files.

Following this, method 240 moves to step 244 to add the decompression function file corresponding to the preset compression algorithm into invoking objects of the first functions. First running functions are searched for from program entries of the invoking files, and the decompression function file corresponding to the preset compression algorithm is added into invoking objects of the first functions.

The decompression function file is a file precompiled for the preset compression algorithm and capable of decompressing the compressed invoked file and loading code of the invoked file.

Referring again to FIG. 2A, after method 200 adds the decompression function file into the initialization objects of the invoking files in step 205, method 200 moves to step 206 to modify the steps of invoking the invoked files by the invoking files to invoke the decompression function file corresponding to the preset compression algorithm. In this embodiment of the present application, the specific implementation is consistent with that described in prior embodiments, the details of which are omitted to avoid repetition.

After this, method 240 moves to step 207 to re-sign functional components in the application belonging to the invoking files. Signing refers to digitally signing the application. Since all programs to be installed must be signed for some operating systems, the systems require all applications to be digitally signed by a certificate before being installed. For example, the Android system confirms an author of an application through the certificate, and the certificate does not need to be certified by an authority.

Generally, an application uses a self-signed certificate of the developer, and the certificate ensures that a trust relationship is established between the application and the author of the application, and is not used for deciding which applications a user can install. Functional components refer to some functions or modules in the application and usually exist in the form of plug-ins, and functional components in the application to which the modified invoking files belong are re-signed.

Optionally, before re-signing the functional components, method 200 can determine in step 207 if the functional components in the application belonging to the invoking files have original signatures. The judging whether the functional components in the application belonging to the invoking files have original signatures may be specifically checking whether the functional components have signatures, and determining that the functional components belonging to the invoking files in the application have original signatures.

Next, method 200 moves to step 208 to encapsulate the dependency file, the modified invoking files, the compressed invoked file, and the decompression function file to obtain a compressed application. The dependency file, the modified invoking files, the compressed invoked file, and the decompression function file are repacked and encapsulated into a new application to obtain a compressed application. The specific encapsulation method may be any appropriate method, which is not limited in this embodiment.

For example, the dependency table file for loading SO files, the modified dex files, all the SO files compressed by the LZMA algorithm, and the precompiled SO file capable of processing the LZMA algorithm are repacked into the APK application; and the obtained APK application is a compressed application.

Next, after the files have been encapsulated in step 208, method 200 moves to step 209 to sign the compressed application. Since all programs to be installed must be signed for some operating systems, the systems require all applications to be digitally signed by a certificate before being installation. The compressed application is signed to ensure that the application can be normally installed and run.

According to this embodiment of the present application, the source application is first decompressed, and invoking files and invoked files are then searched for and found. After this, dependency relationships between the invoked files are determined, and a dependency file recording the dependency relationships is generated.

Next, the invoked files in the source application are compressed using a preset compression algorithm to form a compressed invoked file, for example, using an algorithm having a higher compression rate than that of an original compression algorithm. As a result, the compression rate for compressing the application can then be improved, and an application of a smaller size can be obtained.

Following the formation of the compressed invoked file, the decompression function file is added into an invoking file belonging to a main framework of the application. In addition, the decompression function file is added into initialization objects of the invoking files. Further, the process of invoking the invoked files by the invoking files is modified into invoking of the decompression function file that corresponds to the preset compression algorithm. After this, functional components in the application belonging to the invoking files are re-signed.

Next, modified invoking files, the compressed invoked file, and the decompression function file are encapsulated to obtain the compressed application; and the compressed application is signed, so that the application can invoke an algorithm capable of decompressing the preset compression algorithm for decompression during running. In this way, the problem of being originally incompatible with an algorithm having a high compression rate can be solved. In this case, the application itself can have the function of decompressing a compression algorithm having a high compression rate, and a normal running of an application adopting a higher compression rate is ensured.

Figure 3:
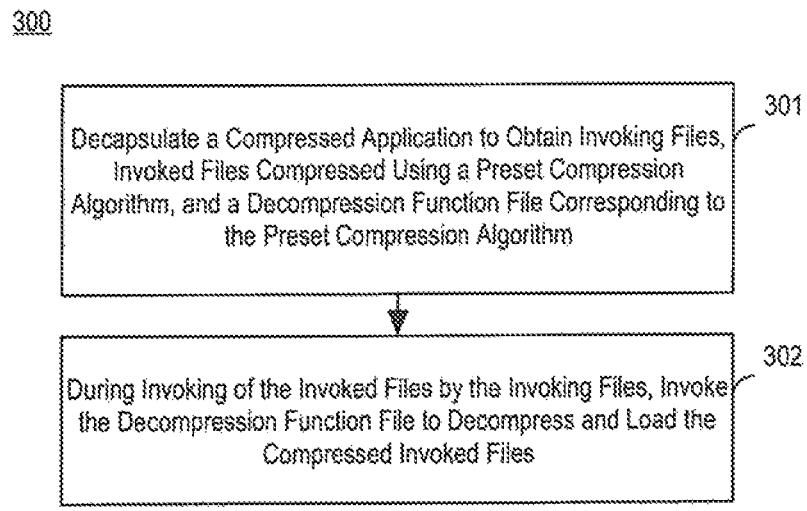
FIG. 3 is a flowchart illustrating an example of a method 300 of decompressing a source application in accordance with the present invention.

FIG. 3 shows a flow chart that illustrates an example of a method 300 of decompressing a source application in accordance with the present invention. As shown in FIG. 3, method 300 begins at step 301 by decapsulating (decompressing) a compressed application using a default decompression algorithm to obtain invoking files, invoked files compressed using a preset compression algorithm, and a decompression function file that uses a preset decompression algorithm which corresponds to the preset compression algorithm. The default decompression algorithm corresponds with a default compression algorithm that has a lower rate of compression than the rate of compression of the preset compression algorithm.

The compressed application is an application partially compressed by the preset compression algorithm and subjected to corresponding modification. The compressed application includes invoking files, invoked files compressed using the preset compression algorithm, and a decompression function file corresponding to the preset compression algorithm. The invoking files are modified to invoke the decompression function file. Specifically, during compression of an application, the process used to invoke the invoked files by the invoking files is modified to invoke the decompression function file corresponding to the preset compression algorithm.

The compressed application is decapsulated (decompressed) to obtain the invoking files, the invoked files compressed using the preset compression algorithm, and the decompression function file corresponding to the preset compression algorithm. For example, an APK application is a compressed application, and the APK application is decompressed to obtain modified dex files, all of the SO files compressed by an LZMA algorithm, and a precompiled SO file (decompression function file) capable of processing the LZMA algorithm.

After the compressed application has been decapsulated (decompressed), method 300 moves from step 301 to step 302 to invoke the invoked files by the invoking files by invoking the decompression function file to decompress and load the compressed invoked files. During invoking of the invoked files by the invoking files, the decompression function file is invoked, and code of the decompression function file is executed to decompress and load the compressed invoked files.

For example, the SO file (decompression function file) for processing the LZMA algorithm is loaded, and code of the SO file for processing the LZMA algorithm is executed to decompress the compressed SO files. Following this, the decompressed SO files are loaded, so as to complete decompression of the compressed application.

According to this embodiment of the present application, a compressed application is decapsulated (decompressed) to obtain invoking files, invoked files compressed using a preset compression algorithm, and a decompression function file corresponding to the preset compression algorithm. During invoking of the invoked files by the invoking files, the decompression function file is invoked to decompress and load the compressed invoked files, so that the compressed application can invoke an algorithm capable of decompressing the preset compression algorithm for decompression during running. In this way, the problem of being originally incompatible with an algorithm having a high compression rate can be solved. In the case, the application itself can decompress a compression algorithm having a high compression rate. As a result, a normal running of an application adopting a higher compression rate is ensured.

Figure 4:
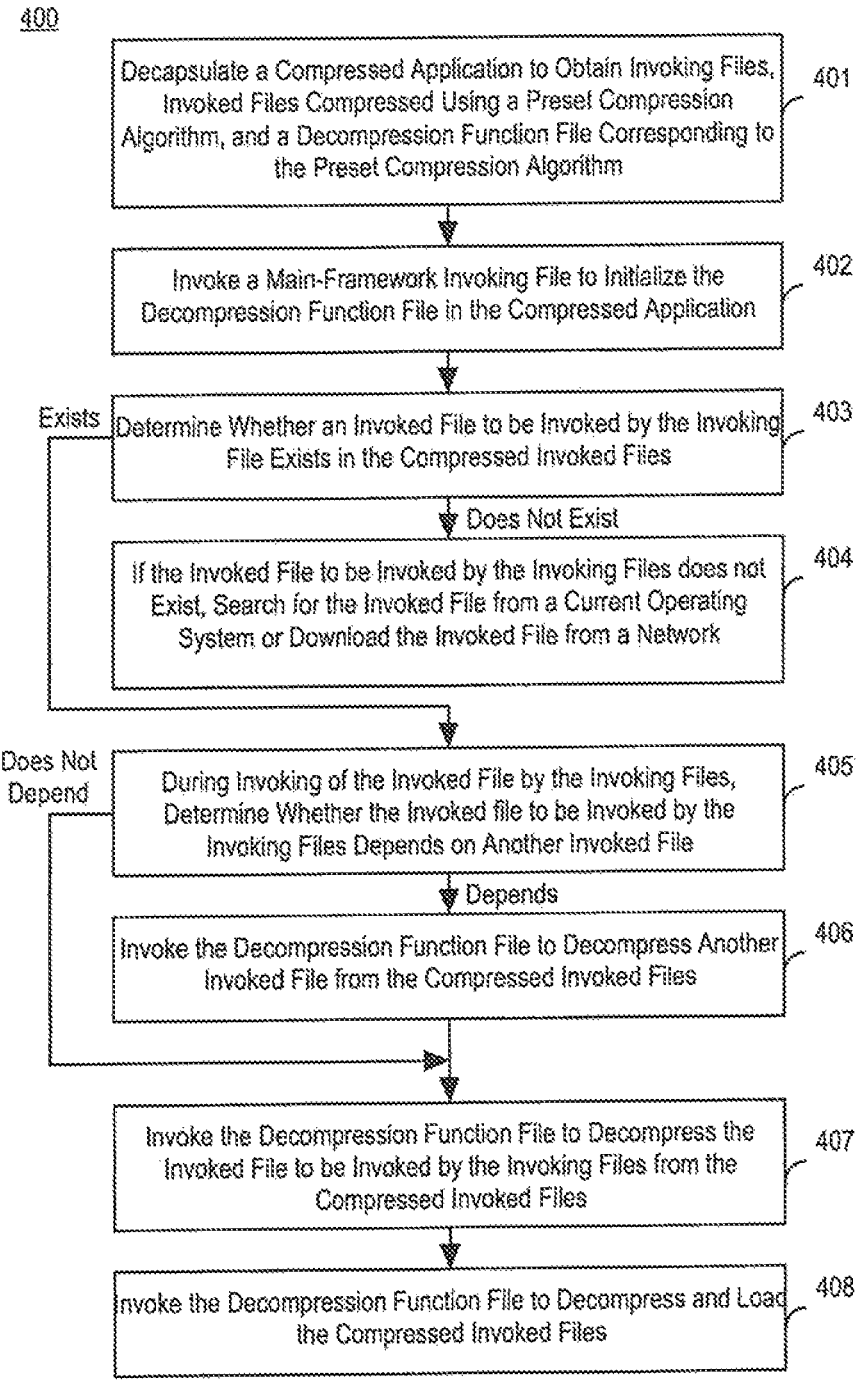
FIG. 4 is a flowchart illustrating an example of a method 400 for decompressing a source application in accordance with the present invention.

FIG. 4 shows a flowchart that illustrates an example of a method 400 for decompressing an application in accordance with the present invention. As shown in FIG. 4, method 400 begins at step 401 by decapsulating (decompressing) a compressed application to obtain invoking files, invoked files compressed using a preset compression algorithm, and a decompression function file corresponding to the preset compression algorithm. In this embodiment of the present application, the specific implementation is consistent with that described in prior embodiments, the details of which are omitted to avoid repetition.

Following this, method 400 moves to step 402 to invoke an invoking file of a main framework to initialize the decompression function file in the compressed application. An initialization object of the main-framework invoking file includes the decompression function file, and an invoking file of a main framework is invoked to initialize the decompression function file in the compressed application.

For example, during running of an APK application, a main dex file is executed, and since invoking functions have been modified in the application compression stage, a function loading a SO file for processing the LZMA algorithm is invoked to load the SO file for processing the LZMA algorithm.

Next, method 400 moves to step 403 to determine if an invoked file to be invoked by the invoking files exists in the compressed invoked files. It is judged whether an invoked file to be invoked by the invoking files exists in the compressed invoked files.

If the invoked file to be invoked by the invoking files does not exist, method 400 moves to step 404 to search for the invoked file in a current operating system or download the invoked file from a network. On the other hand, if the invoked file to be invoked by the invoking files exists in the compressed invoked files, method 400 moves to step 405.

For example, it is determined in step 403 whether a SO file to be loaded exists in files compressed by the LZMA algorithm.

In this embodiment of the present application, for invoked files invoked by the invoking files, some are in the compressed invoked files, some are in an operating system, and some are on a network; and if the invoked file to be invoked by the invoking files does not exist in the compressed invoked files, the invoked file may be searched for from the current operating system, or the invoked file may be downloaded from the network.

In step 405, during invoking of the invoked file by the invoking files, method 400 determines whether the invoked file to be invoked by the invoking files depends on another invoked file. During invoking of the invoked file by the invoking files, it is judged whether the invoked file to be invoked by the invoking files depends on another invoked file, which may be specifically performed according to a dependency file obtained by decapsulating (decompressing) the compressed application, wherein the dependency file records dependency relationships between the invoked files. As a result, it is determined whether the invoked file to be invoked by the invoking files depends on another (a second) invoked file.

When the invoked file depends on the another (the second) invoked file, method 400 moves to step 406 to invoke the decompression function file to decompress the another (the second) invoked file from the compressed invoked files. The invoking the decompression function file to decompress the another (the second) invoked file from the compressed invoked files may be specifically decompressing the files compressed by the preset compression algorithm using a corresponding decompression algorithm in the decompression function file, so as to obtain the another (the second) invoked file on which the invoked file depends.

Following this, method 400 moves from step 405 to step 407, or step 406 to step 407, to invoke the decompression function file to decompress the invoked file to be invoked by the invoking files from the compressed invoked files. Invoking the decompression function file to decompress the required invoked files from the compressed invoked files may be specifically decompressing the files compressed by the preset compression algorithm using a corresponding decompression algorithm in the decompression function file, so as to obtain the invoked file to be invoked.

After this, method 400 moves to step 408 to invoke the decompression function file to decompress and load the compressed invoked files. In this embodiment of the present application, the specific implementation is consistent with that described in prior embodiments, the details of which are omitted to avoid repetition.

According to this embodiment of the present application, a compressed application is decapsulated (decompressed) to obtain invoking files, invoked files compressed using a preset compression algorithm, and a decompression function file corresponding to the preset compression algorithm. In addition; an invoking file of a main framework is invoked to initialize the decompression function file in the compressed application. Further; it is determined whether an invoked file to be invoked by the invoking files exists in the compressed invoked files.

If the invoked file to be invoked by the invoking files does not exist, the invoked file is searched for in a current operating system or the invoked file is downloaded from a network. On the other hand, if the invoked file exists, during invoking of the invoked file by the invoking files, it is determined whether the invoked file to be invoked by the invoking files depends on another invoked file. If the invoked file depends on the another file, the decompression function file is invoked to decompress the another invoked file from the compressed invoked files.

In addition, the decompression function file is invoked to decompress the invoked file to be invoked by the invoking files from the compressed invoked files. Further, the decompression function file is invoked to decompress and load the compressed invoked files. The compressed application can then invoke an algorithm capable of decompressing the preset compression algorithm for decompression during running.

In this way, the problem of being originally incompatible with an algorithm having a high compression rate can be solved. In this case, the application itself can decompress a compression algorithm having a high compression rate;a and a normal running of an application adopting a higher compression rate is ensured.

To enable those skilled in the art to better understand the present application, a verification method of the present application is described below through a specific example.

Figure 5:
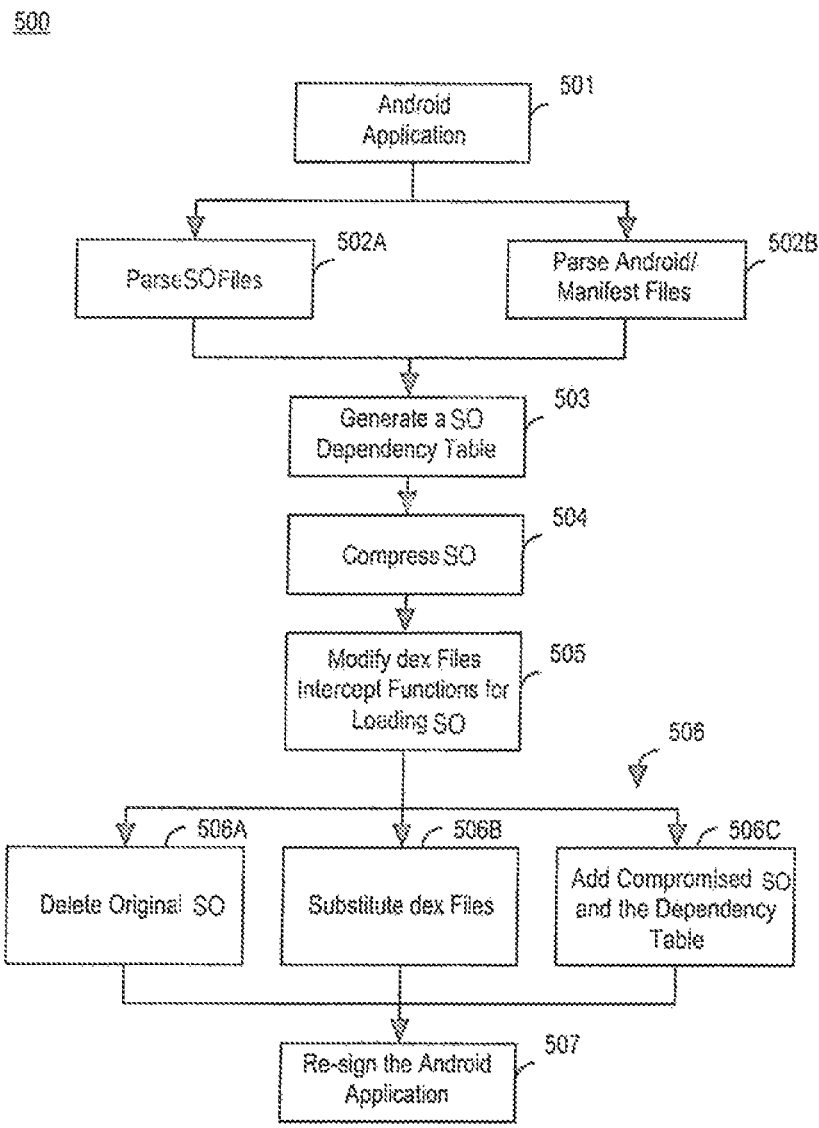
FIG. 5 is a diagram illustrating an example of a compression process 500 in accordance with an embodiment of the present invention.

FIG. 5 is a diagram that illustrates an example of a compression process 500 in accordance with an embodiment of the present invention. As shown in FIG. 5, process 500 begins at 501 with decompressing an incoming Android application package (APK). After this, process 500 moves to step 502A to parse the files to find all of the SO files in the compressed package, and to step 502B to parse the AndroidManifest.xml files.

Next, process 500 moves to step 503 to generate a SO dependency table. Since loading SO files requires corresponding dependency relationships, a dependency relationship table of all SO files in the APK application is generated. Following this, process 500 moves to step 504 to compress all of the SO files. In order to reduce the size, all of the SO files are compressed into one compressed file using an LZMA algorithm to form a compressed invoked file. Meanwhile, a precompiled SO file (decompression function file) capable of processing the LZMA algorithm is added.

After the SO files have been compressed, process 500 moves to step 505 to modify the dex (executable) file. Since all of the SO files in an original program are compressed into one SO file, the functions for loading SO files on a java layer must be intercepted and converted through the SO file dependency relationship table when being invoked during running.

Next, process 500 moves to steps 506A, 506B, and 506C to pack the file. The precompiled SO file capable of processing the LZMA algorithm, the SO dependency relationship table, all of the SO files compressed by the LZMA algorithm, and modified dex files are repacked into an Android application. Meanwhile, the original SO files are deleted. After this, process 500 moves to step 507 to re-sign. The repacked Android application is re-signed using a signature file of the original program.

Figure 6:
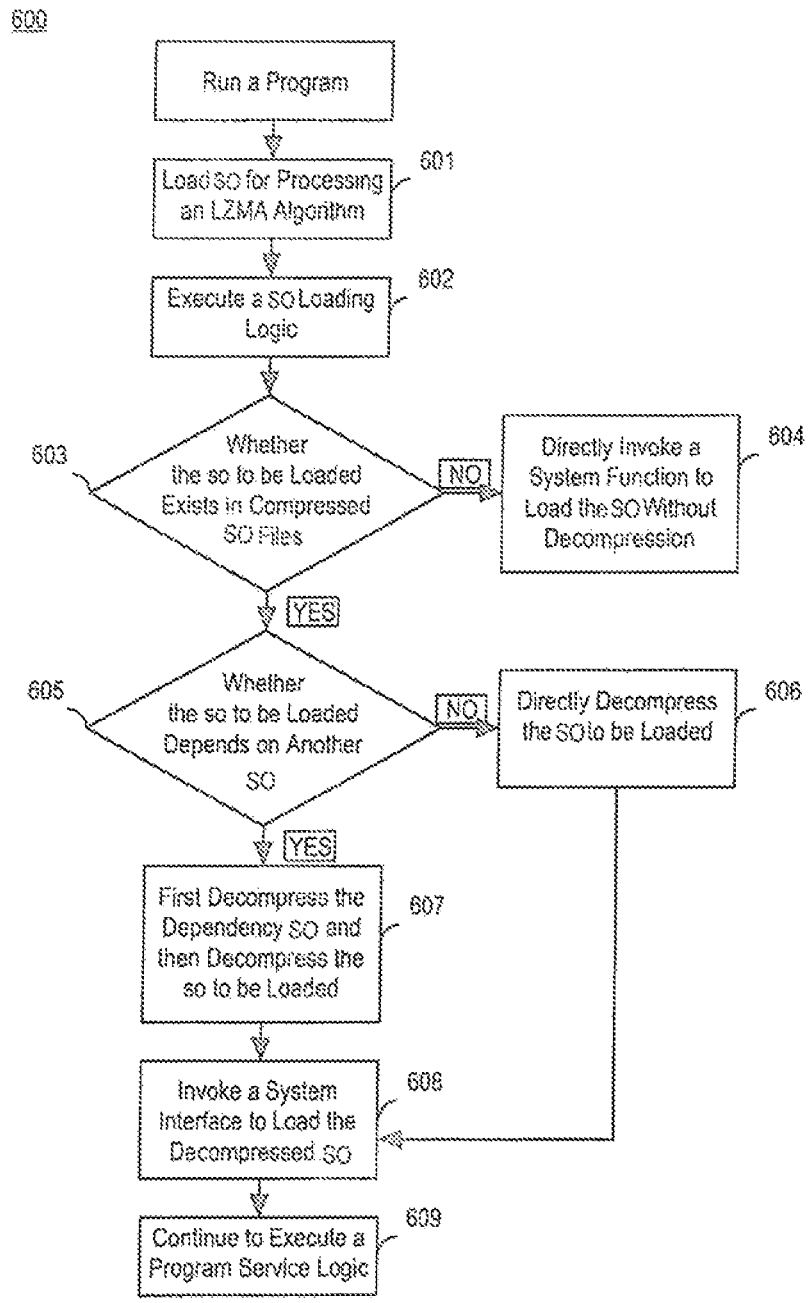
FIG. 6 is a diagram illustrating an example of a decompression process 600 in accordance with an embodiment of the present invention.

FIG. 6 is a diagram that illustrates an example of a decompression process 600 in accordance with an embodiment of the present invention. As shown in FIG. 6, process 600 begins at 601 with loading a SO file capable of decompressing files compressed by an LZMA algorithm, so that the APK application has the function of decompressing the LZMA-compressed files.

After this, process 600 moves to step 602. In 602, when the application needs to load a SO file, i.e., execute a SO file loading logic, since invoking functions have been modified in the packing stage, a self-defined function for loading a SO file is invoked. Next, process 600 moves to step 603 to determine whether the SO file to be loaded exists in the LZMA-compressed files.

If the SO file does not exist in the LZMA-compressed files, process 600 moves to step 604 to directly invoke a system function to load the SO file without decompression. Step 604 indicates that a SO file of the system is loaded or a SO file is dynamically downloaded from the network, and the SO file is directly loaded by invoking a system function without decompression.

If the SO file does exist, process 600 instead moves to step 605 to determine whether the SO file to be loaded depends on another SO file. If the SO file to be loaded does not depend on another SO file, process 600 moves to step 606 to directly decompress the SO file to be loaded.

If the SO file does depend on another SO file, process 600 instead moves to step 607 to first decompress the dependency SO file, and then decompress the SO file to be loaded. Process 600 decompresses, according to the name of an incoming SO file, the SO file from the pre-built-in LZMA-compressed files. If the loading of the SO file needs to depend on other SO files, the other SO files also need to be decompressed.

After this, process 600 moves from step 607 to step 608, or from step 606 to step 608, to obtain the path of the decompressed SO file, and invoke a system interface to load the SO file, so as to complete loading. The process then moves to step 609 to continue to execute a program service logic.

Figure 7A:
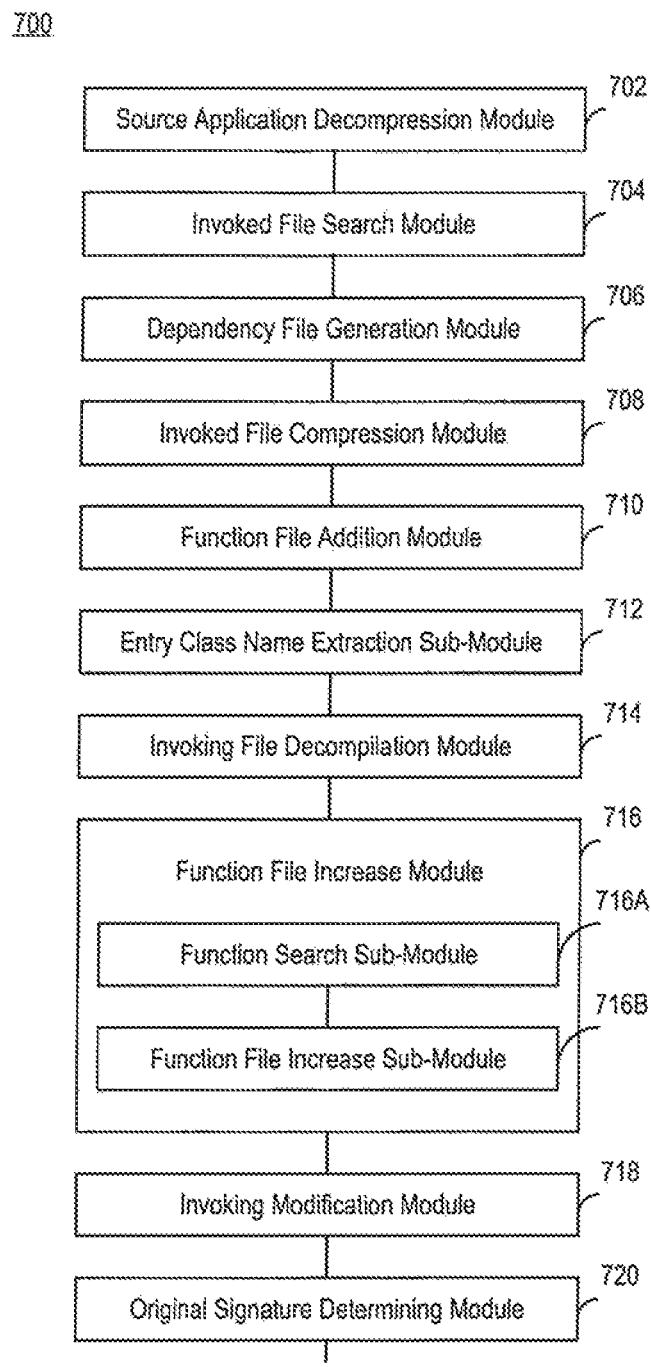
FIGS. 7A and 7B are a diagram illustrating an example of an apparatus 700 that includes a number of modules for compressing an application in accordance with an embodiment of the present invention.
Figure 7B:
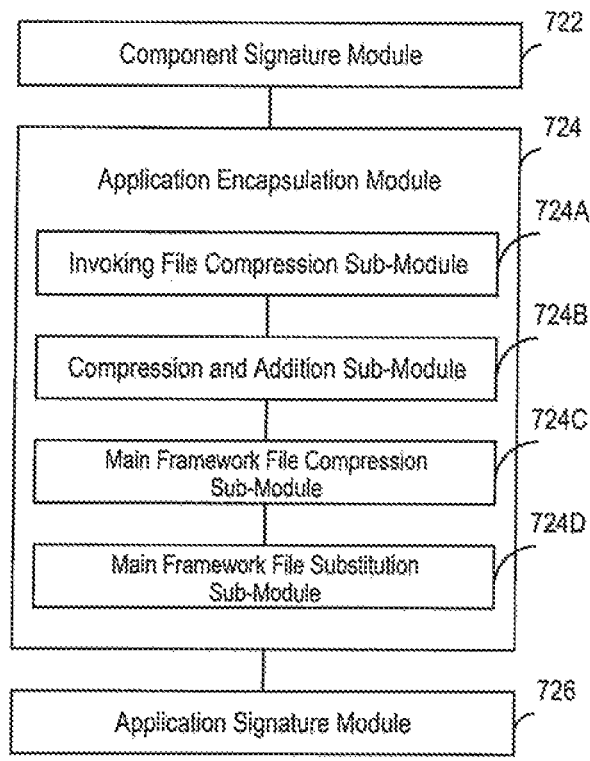

FIGS. 7A and 7B are a diagram that illustrates an example of an apparatus 700 that includes a number of modules for compressing an application in accordance with an embodiment of the present invention. The modules can be, for example, software modules, while apparatus 700 is a processor that executes the software modules.

As shown in FIGS. 7A and 7B, apparatus 700 includes a source application decompression module 702, which is configured to decompress the source application and search for the invoking files and the invoked files. Apparatus 700 also includes an invoked file search module 704, which is configured to search for invoked files in the source application that are compressible using the preset compression algorithm.

In an embodiment, the invoked files are dynamic link library files, and the invoking files are executable files invoking the dynamic link library files. In addition, the invoked file search module 704 is specifically configured to search for the dynamic link library files from multiple types of files included in the source application.

As further shown in FIGS. 7A and 7B, apparatus 700 includes a dependency file generation module 706, which is configured to determine dependency relationships between the invoked files, and generate a dependency file recording the dependency relationships. Apparatus 700 additionally includes an invoked file compression module 708, which is configured to compress invoked files in a source application using a preset compression algorithm. Source application decompression module 702 and invoked file search module 704 both search before the invoked files are compressed by module 708.

Further, apparatus 700 includes a function file addition module 710, which is configured to add the decompression function file into an invoking file belonging to a main framework of the application, and an entry class name extraction sub-module 712, which is configured to extract an entry class name at a program entry location of the source application from a global application configuration file of the source application.

In addition, apparatus 700 includes an invoking file decompilation module 714, which configured to decompile the corresponding invoking files, and a function file increase module 716, which is configured to add the decompression function file into initialization objects of the invoking files. In an embodiment, the function file increase module 716 includes a function search sub-module 716A, which is configured to search for first running functions at program entry locations of the invoking files, and a function file increase sub-module 716B, which is configured to add the decompression function file corresponding to the preset compression algorithm into invoking objects of the first functions.

As further shown in FIGS. 7A and 7B, apparatus 700 also includes an invoking modification module 718, which is configured to modify the process of invoking the invoked files by invoking files into invoking a decompression function file corresponding to the preset compression algorithm, wherein the decompression function file is used for decompressing and loading a compressed invoked file.

Apparatus 700 additionally includes an original signature determining module 720, which is configured to determine whether the functional components belonging to the invoking files in the application have original signatures.

In an embodiment, apparatus 700 further includes a component signature module 722, which is configured to re-sign functional components in the application belonging to the invoking files. Original signature determining module 720 determines original signatures before the functional components are re-signed.

In addition, apparatus 700 includes an application encapsulation module 724, which is configured to encapsulate the modified invoking files, the compressed invoked file, and the decompression function file to obtain a compressed application. The component signature module 722 re-signs the functional components before the modified invoking files, the compressed invoked file, and the decompression function file are encapsulated to obtain a compressed application.

In an embodiment, the application encapsulation module 724 is specifically configured to encapsulate (compress) the dependency file, the modified invoking files, the compressed invoked file, and the decompression function file to obtain the compressed application. In an embodiment, the application encapsulation module 724 includes an invoking file compression sub-module 724A, which is configured to compress the modified invoking files and replace them to locations of the invoking files before modification.

The application encapsulation module 724 also includes a compression and addition sub-module 724B, which is configured to compress the compressed invoked file and the decompression function file, and add them into the source application to obtain the compressed application.

In an embodiment, the application encapsulation module 724 further includes a main-framework file compression sub-module 724C, which is configured to extract and compress an invoking file belonging to a main framework of the application to obtain a compressed main-framework file, wherein the decompression function file has been added into the main-framework invoking file.

The application encapsulation module 724 also includes a main-framework file substitution sub-module 724D, which is configured to replace an original main-framework file of the source application with the compressed main-framework file.

In an embodiment, apparatus 700 further includes an application signature module 726, which is configured to sign the compressed application. In an embodiment, the preset compression algorithm is an LZMA algorithm.

According to this embodiment of the present application, first, invoked files in a source application are compressed using a preset compression algorithm, for example, using an algorithm having a higher compression rate than that of an original compression algorithm. As a result, the compression rate for compressing the application can then be improved, and an application of a smaller size can be obtained.

Further, the process of invoking the invoked files by the invoking files is modified into invoking a decompression function file corresponding to the preset compression algorithm. Next, the modified invoking files, a compressed invoked file, and the decompression function file are encapsulated (compressed) to obtain a compressed application. The modified invoking files, a compressed invoked file, and the decompression function file are compressed with an algorithm that has a rate of compression that is less than the rate of compression of the preset compression algorithm used to compress the invoked files into the compressed invoked file.

The application can then invoke an algorithm capable of decompressing the preset compression algorithm for decompression during running. In this way, the problem of being originally incompatible with an algorithm having a high compression rate can be solved. In this case, the application itself can have the function of decompressing a compression algorithm having a high compression rate, and a normal running of an application adopting a higher compression rate is ensured.

Figure 8:
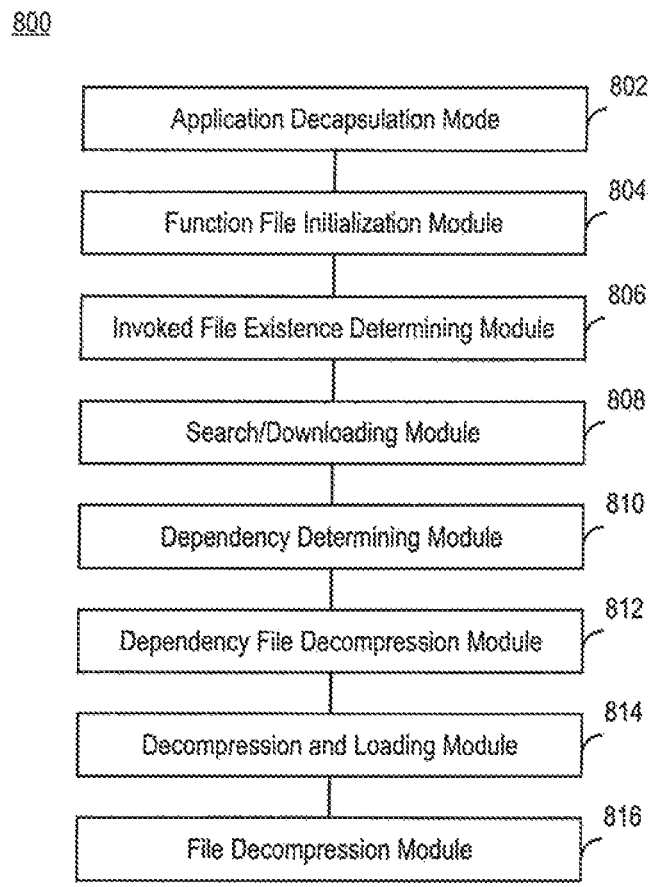
FIG. 8 is a diagram illustrating an example of an apparatus 800 that includes a number of modules for decompressing an application in accordance with an embodiment of the present invention.

FIG. 8 is a diagram that illustrates an example of an apparatus 800 that includes a number of modules for decompressing an application in accordance with an embodiment of the present invention. The modules can be, for example, software modules, while apparatus 800 is a processor that executes the software modules.

As shown in FIG. 8, apparatus 800 includes an application decapsulation module 802, which is configured to decapsulate (decompress) a compressed application to obtain invoking files, invoked files compressed using a preset compression algorithm, and a decompression function file corresponding to the preset compression algorithm, wherein the invoking files are modified to invoke the decompression function file.

As further shown in FIG. 8, apparatus 800 also includes a function file initialization module 804, which is configured to invoke an invoking file of a main framework to initialize the decompression function file in the compressed application. In an embodiment, apparatus 800 additionally includes an invoked file existence determining module 806, which is configured to determine whether an invoked file to be invoked by the invoking files exists in the compressed invoked files.

In an embodiment, apparatus 800 further includes a search/downloading module 808, which is configured to, if the invoked file to be invoked by the invoking files does not exist, search for the invoked file in a current operating system or download the invoked file from a network.

In an embodiment, apparatus 800 also includes a dependency determining module 810, which is configured to determine whether the invoked file to be invoked by the invoking files depends on another invoked file. Apparatus 800 additionally includes a dependency file decompression module 812, which is configured to invoke the decompression function file to decompress the another invoked file from the compressed invoked files.

In an embodiment, apparatus 800 further includes a decompression and loading module 814, which is configured to, during invoking of the invoked files by the invoking files, invoke the decompression function file to decompress and load the compressed invoked files. In addition, apparatus 800 includes a file decompression module 816, which is configured to invoke the decompression function file to decompress the invoked file to be invoked by the invoking files from the compressed invoked files.

Function file initialization module 804 invokes an invoking file of a main framework before invoking the decompression function file to decompress and load the compressed invoked files. Invoked file existence determining module 806 determines existence before invoking the decompression function file to decompress and load the compressed invoked files. Dependency determining module 810 determines dependency before invoking the decompression function file to decompress and load the compressed invoked files.

According to this embodiment of the present application, a compressed application is decapsulated (decompressed) to obtain invoking files, invoked files compressed using a preset compression algorithm, and a decompression function file corresponding to the preset compression algorithm. During invoking of the invoked files by the invoking files, the decompression function file is invoked to decompress and load the compressed invoked files.

The compressed application can then invoke an algorithm capable of decompressing the preset compression algorithm for decompression during running. In this way, the problem of being originally incompatible with an algorithm having a high compression rate can be solved. In this case, the application itself can decompress a compression algorithm having a high compression rate, and a normal running of an application adopting a higher compression rate is ensured.

Since the apparatus embodiments basically correspond to the foregoing method embodiments shown in FIG. 1, FIG. 2, FIG. 3, and FIG. 4, reference may be made to the relevant description in the foregoing embodiments for parts that are not detailed in this embodiment, details of which are omitted to avoid repetition.

Algorithms and displays provided herein are not inherently relevant to any specific computers, virtual systems, or other devices. Various general-purpose systems can be used together with teachings herein. According to the above description, it is obvious to know what a structure is needed to construct such systems. Furthermore, the present application is not based on any specific programing languages. It should be understood that various programming languages can be used to implement the contents of the present application described herein. The above description of specific languages aims to disclose the best implementation mode of the present application.

A large number of specific details are described in the specification provided herein. However, it can be understood that embodiments of the present application can be implemented without these specific details. In some examples, well-known methods, structures, and techniques are not provided in detail so as not to pose difficulties in understanding this specification.

Similarly, it should be understood that in order to simplify the present disclosure and facilitate the understanding of one or more of various application aspects, various features of the present application are, in certain cases, combined in a single embodiment, diagram or description thereof in the above description of exemplary embodiments of the present application. However, the method of the present disclosure should not be interpreted as reflecting the following intention: the present application for which protection is sought requires more features than those expressly recited in each claim. More specifically, as the following claims reflect, the application may have features less than all features of a single disclosed embodiment. Thus, the claims following a specific embodiment are hereby explicitly incorporated into the specific embodiment, with each claim standing on its own as a separate embodiment of the present application.

Those skilled in the art can understand that modules in the device in an embodiment can be changed adaptively and arranged in one or more devices different from the embodiment. Modules, units, or components in the embodiments can be combined into one module, unit, or component and they can also be divided into multiple sub-modules, sub-units, or sub-components. All of the features disclosed in this specification (including accompanying claims, abstract and drawings), and all of the processes or units of any method or device so disclosed, may be combined in any combination, except combinations where at least some of such features and/or processes or units are mutually exclusive. Each feature disclosed in this specification (including accompanying claims, abstract and drawings) may be replaced by an alternative feature serving the same, equivalent or similar purpose, unless expressly stated otherwise.

Furthermore, those skilled in the art can understand that while some embodiments described herein include some but not other features of other embodiments, combinations of features of different embodiments are meant to be within the scope of the present application and form different embodiments. For example, in the following claims, any one of the claimed embodiments can be used in any combination.

Each component embodiment of the present application may be implemented by hardware, or may be implemented by software modules running on one or more processors, or may be implemented by a combination of hardware and software modules. Those skilled in the art should understand that some or all of the functions of some or all of the components in the device for identifying server intrusion based on data analysis according to the embodiments of the present application may be implemented by using a microprocessor or a digital signal processor (DSP) in practice. The present application may further be implemented as device or apparatus programs (such as a computer program and a computer program product) for performing part or all of the method described here. Such programs for implementing the present application may be stored in a computer-readable medium, or may be in the form of one or more signals. Such signals may be obtained by downloading from Internet sites, or may be provided on carrier signals, or may be provided in any other forms.

It should be noted that the aforementioned embodiments explain the present application rather than limiting the present application, and those skilled in the art can design alternative embodiments without departing from the scope of the appended claims. Any reference signs in parentheses in the claims should not be construed as limiting the claims. The word "include" or "comprise" does not exclude the elements or steps not listed in the claims. The word "a" or "an" before elements does not exclude the situation that there are a plurality of such elements. The present application may be implemented by means of hardware including several different elements and by means of a computer that is programmed properly. In the unit claims in which several apparatuses are listed, several of the apparatuses may be specifically implemented by the same hardware. The words "first", "second", "third" and so on do not indicate any sequence. These words may be interpreted as names.

What is claimed is:

1. A method for compressing an application, comprising:
compressing at least one invoked file in a source application using a compression algorithm to form a compressed invoked file;
modifying at least one invoking file to form a modified invoking file, the modified invoking file to invoke a decompression function file corresponding to the compression algorithm, the decompression function file to decompress the compressed invoked file and load a decompressed invoked file; and
encapsulating the modified invoking file, the compressed invoked file, and the decompression function file to obtain a compressed application.

2. The method according to claim 1, further comprising, before compressing the at least one invoked file, searching for invoked files in the source application that are compressible using the compression algorithm.

3. The method according to claim 2, wherein the at least one invoked file is a dynamic link library file, the at least one invoking file is an executable file invoking the dynamic link library file, and the searching for invoked files in the source application that are compressible using the compression algorithm comprises searching for the dynamic link library file from multiple types of files in the source application.

4. The method according to claim 1, further comprising adding a decompression function file into initialization objects of the at least one invoking file.

5. The method according to claim 4, further comprising adding the decompression function file into an invoking file belonging to a main framework of the application.

6. The method according to claim 4, wherein adding a decompression function file into initialization objects of the invoking file comprises:
searching for first running functions at program entry locations of the invoking file; and
adding a decompression function file corresponding to the first compression algorithm into invoking objects of the first function.

7. The method according to claim 4, further comprising, before adding a decompression function file into initialization objects of the invoking file, extracting an entry class name at a program entry location of the source application from a global application configuration file of the source application.

8. The method according to claim 1, further comprising adding the decompression function file into an invoking file belonging to a main framework of the application.

9. The method according to claim 8, further comprising decompiling the corresponding invoking file.

10. The method according to claim 1, further comprising decompiling the corresponding invoking file.

11. The method according to claim 1, further comprising determining dependency relationships between the invoked files, and generating a dependency file recording the dependency relationships.

12. The method according to claim 11, wherein encapsulating the modified invoking file, the compressed invoked file, and the decompression function file to obtain a compressed application comprises encapsulating the dependency file, the modified invoking file, the compressed invoked file, and the decompression function file to obtain the compressed application.

13. The method according to claim 1, wherein encapsulating the modified invoking file, the compressed invoked file, and the decompression function file to obtain a compressed application comprises:
compressing the modified invoking file and replacing them to locations of the at least one invoking file before modification; and
compressing the compressed invoked file and the decompression function file and adding them into the source application to obtain the compressed application.

14. The method according to claim 13, wherein encapsulating the modified invoking file, the compressed invoked file, and the decompression function file to obtain a compressed application further comprises:
extracting and compressing an invoking file belonging to a main framework of the application to obtain a compressed main-framework file, wherein the decompression function file has been added into the main-framework invoking file; and
replacing an original main-framework file of the source application with the compressed main-framework file.

15. The method according to claim 1, further comprising, after encapsulating the modified invoking file, the compressed invoked file, and the decompression function file to obtain a compressed application, re-signing functional components belonging to the at least one invoking file in the application.

16. The method according to claim 15, wherein before re-signing functional components belonging to the at least one invoking file in the application, the method further comprises determining that the functional components belonging to the at least one invoking file in the application have original signatures.

17. The method according to claim 1, further comprising, before compressing an invoked file in a source application using a compression algorithm, decompressing the source application and searching for the at least one invoking file and the at least one invoked file.

18. The method according to claim 1, further comprising signing the compressed application, wherein the compression algorithm is an LZMA algorithm.

19. The method according to claim 1, wherein the compression algorithm has a higher rate of compression than a default compression algorithm.

20. A method for decompressing an application, comprising:
decapsulating a compressed application using a first decompression algorithm to obtain invoking files, invoked files compressed using a preset compression algorithm, and a decompression function file using a second decompression algorithm that corresponds to the preset compression algorithm, the invoking files being modified to invoke the decompression function file; and
during invoking of the invoked files by the invoking files, invoking the decompression function file to decompress and load the compressed invoked files, the first decompression algorithm corresponding to a first compression algorithm that has a rate of compression that is less than a rate of compression of the preset compression algorithm.

21. The method according to claim 20, further comprising, before invoking the decompression function file to decompress and load the compressed invoked files, invoking an invoking file of a main framework to initialize the decompression function file in the compressed application.

22. The method according to claim 20, further comprising, before invoking the decompression function file to decompress and load the compressed invoked files, determining whether an invoked file to be invoked by the invoking files exists in the compressed invoked files.

23. The method according to claim 22, further comprising, if the invoked file to be invoked by the invoking files does not exist, searching for the invoked file in a current operating system or downloading the invoked file from a network.

24. The method according to claim 20, wherein before invoking the decompression function file to decompress and load the compressed invoked files, the method comprises:
   determining that the invoked file to be invoked by the invoking files depends on another invoked file;
   invoking the decompression function file to decompress the another invoked file in the compressed invoked files; and
   invoking the decompression function file to decompress the invoked file to be invoked by the invoking files in the compressed invoked files.

25. The method according to claim 22, wherein before invoking the decompression function file to decompress and load the compressed invoked files, the method comprises:
   determining that the invoked file to be invoked by the invoking files depends on another invoked file;
   invoking the decompression function file to decompress the another invoked file in the compressed invoked files; and
   invoking the decompression function file to decompress the invoked file to be invoked by the invoking files in the compressed invoked files.

26. A non-transitory computer-readable medium having computer-readable instructions stored thereon to be executed by a processor to perform a method for compressing an application, the method comprising:
   compressing at least one invoked file in a source application using a compression algorithm to form a compressed invoked file;
   modifying at least one invoking file to form a modified invoking file, the modified invoking file to invoke a decompression function file corresponding to the compression algorithm, the decompression function file to decompress the compressed invoked file and load a decompressed invoked file; and
   encapsulating the modified invoking file, the compressed invoked file, and the decompression function file to obtain a compressed application.

27. A non-transitory computer-readable medium having computer-readable instructions stored thereon to be executed by a processor to perform a method for decompressing an application, the method comprising:
   decapsulating a compressed application using a first decompression algorithm to obtain invoking files, invoked files compressed using a preset compression algorithm, and a decompression function file using a second decompression algorithm that corresponds to the preset compression algorithm, the invoking files being modified to invoke the decompression function file; and
   during invoking of the invoked files by the invoking files, invoking the decompression function file to decompress and load the compressed invoked files, the first decompression algorithm corresponding to a first compression algorithm that has a rate of compression that is less than a rate of compression of the preset compression algorithm.

* * * * *